United States Patent [19]

Yamada et al.

[11] Patent Number: 5,083,292
[45] Date of Patent: Jan. 21, 1992

[54] BIPOLAR RANDOM ACCESS MEMORY

[75] Inventors: Katsuyuki Yamada, Kasugai; Teruaki Maeda, Seto; Yoshichika Nakaya, Kasugai, all of Japan

[73] Assignee: Fujitsu Limited, Kawasaki, Japan

[21] Appl. No.: 490,920

[22] Filed: Mar. 9, 1990

[30] Foreign Application Priority Data

Mar. 13, 1989 [JP] Japan .................................. 1-60039

[51] Int. Cl.$^5$ .............................................. G11C 11/00
[52] U.S. Cl. .................... 365/155; 365/179; 365/208; 365/225.6; 365/226
[58] Field of Search ...................... 365/225.6, 179, 208, 365/226, 155

[56] References Cited

U.S. PATENT DOCUMENTS

| 3,174,058 | 3/1965 | Xylander | 365/225.6 |
|---|---|---|---|
| 3,786,442 | 1/1974 | Alexander et al. | 365/179 |
| 4,663,741 | 5/1987 | Reinschmidt et al. | 365/225.6 |
| 4,788,662 | 11/1988 | Mori | 365/179 |
| 4,853,898 | 8/1989 | Hashemi et al. | 365/225.6 |

FOREIGN PATENT DOCUMENTS

| 57-92482 | 6/1982 | Japan | 365/179 |
|---|---|---|---|
| 58-3184 | 1/1983 | Japan | 365/179 |
| 58-155595 | 9/1983 | Japan | 365/179 |
| 59-3784 | 1/1984 | Japan | 365/179 |
| 60-66388 | 4/1985 | Japan | 365/179 |
| 62-80895 | 1/1987 | Japan . | |

Primary Examiner—Joseph E. Clawson, Jr.
Attorney, Agent, or Firm—Staas & Halsey

[57] ABSTRACT

A bipolar random access memory comprises a plurality of memory cells arranged in row and column formation, a plurality of word lines provided in correspondence to respective rows of the memory cells, a plurality of bit lines provided in correspondence to respective columns of the memory cells, a row addressing part connected to each of the plurality of word lines, a column addressing part connected to each pair of the adjacent bit lines, a read/write controller supplied with a cell information to be written into an addressed memory cell and further with a read/write control signal indicating whether the random access memory is to be operated in a reading mode or in a writing mode and acting as a current source in the reading and writing modes, a first current control part provided in each column of the memory cells so as to be connected to one of the bit lines in a column selected by the column addressing part at the first side of each of the memory cells, a second current control part provided in each column of the memory cells so as to be connected to the other of the bit lines in the selected colunmn, and a third current control part connected to the first and second current control parts for controlling the first and second current control parts such that the write current in the bit lines connected to the side each of the memory cells to which an information is to be written is increased and such that the write current in the bit lines connected to the side of each of the memory cell to which the information is not written is decreased in the writing mode.

10 Claims, 6 Drawing Sheets

will be discarded …

BIPOLAR RANDOM ACCESS MEMORY

BACKGROUND OF THE INVENTION

1. Technical Field

The present invention generally relates to semiconductor memories and more particularly to a bipolar random access memory constructed of bipolar transistors.

2. Description of Related Art

Random access memories (RAM) used in buffer memories are required to have a particularly high operational speed, and for this reason, constructed of bipolar transistors. In such a RAM, reading and writing are carried out by flowing (passing) a read current and a write current to a selected memory cell via a selected word line and further through a selected bit line. In order to increase the operational speed, particularly of the writing speed of the memory, it is essential as well as desirable to increase the write current flowing from the selected bit line passing through the selected cell at the time of writing. By increasing the write current as such, transition of a bipolar transistor which forms a flip-flop circuit in the memory cell together with another bipolar transistor from a turn-off state to a turn-on state occurs in a reduced time, and the memory cell changes its state quickly.

Figure 1:
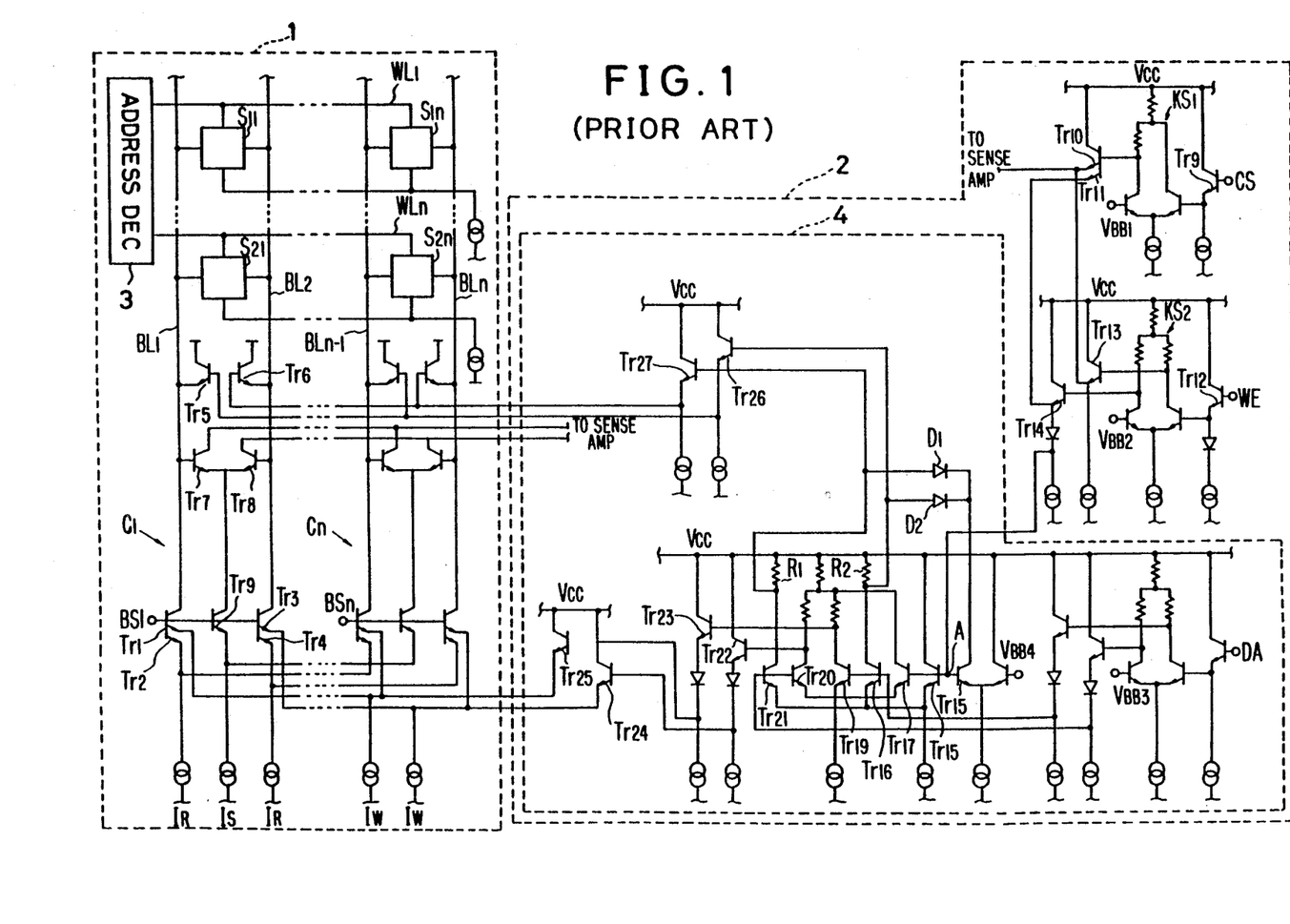
FIG. 1 is a circuit diagram showing a prior bipolar random access memory.
Figure 2:
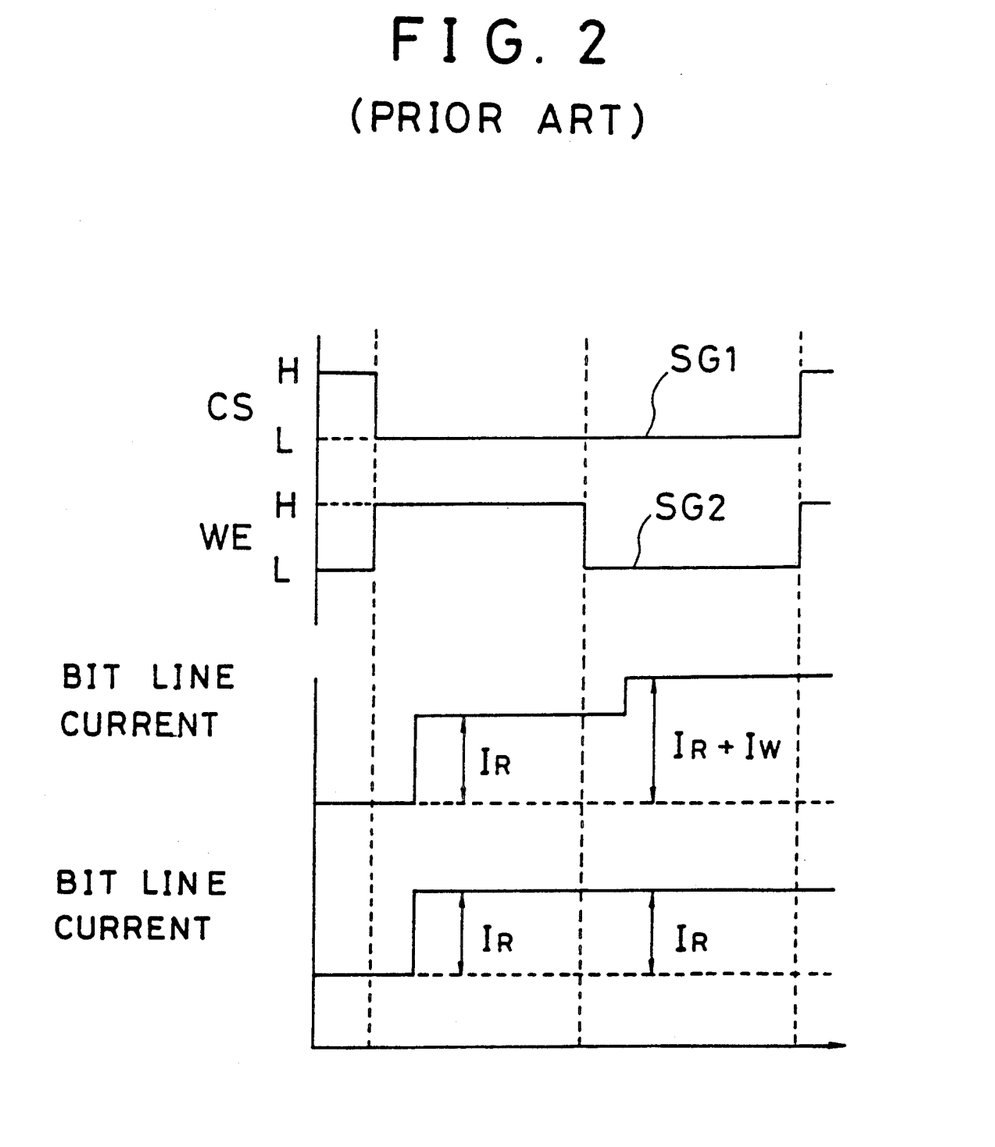
FIG. 2 is a diagram for explaining the reading and writing operation of the bipolar random access memory of FIG. 1.

FIGS. 1 and 2 show the typical construction and operation of a prior art bipolar random access memory. Referring to FIG. 1, the memory comprises a cell region 1 including a number of memory cells for storing cell information arranged in row and column formation and a control part 2 for controlling the reading and writing of cell information. In the cell region 1, a number of word lines WL1–WLn are connected to an address decoder 3, and the address decoder 3 sets the logic level of a desired word line to a level H in response to an address signal supplied thereto. When the level of the word line WL1 is changed to the level H for example, reading and writing of cell information becomes possible for a group of cells S11–S1n connected commonly to the word line WL1 via a pair of adjacent bit lines selected from a group of bit lines BL1–BLn. As already noted, each of the cells includes a flip-flop circuit of bipolar transistors.

Next, the bipolar memory of FIG. 1 will be described. As can be seen in FIG. 1, the cells are arranged in the cell region 1 in the form of a number of columns C1–Cn. For example, the column C1 includes cells S11, S21, etc. As each of the columns C1–Cn have an identical construction, only the column C1 will be described hereinafter and descriptions for the other columns will be omitted.

Referring to FIG. 1, transistors Tr1, Tr2, Tr3 and Tr4, each having its own emitter together with a common base and a common collector, are connected to bit lines BL1 and BL2 for bit line selection, and these transistors Tr1, Tr2, Tr3 and Tr4 are operated simultaneously in response to a bit line selection signal supplied to an input terminal BS1 from a column decoder not illustrated. Further, there are provided a pair of transistors Tr5 and Tr6 having emitters connected respectively to the bit line B11 and the bit line BL2 and bases connected respectively to emitters of transistors Tr26 and Tr27 to be described later. Further, another pair of transistors Tr7 and Tr8 are provided such that bases thereof are connected to the bit lines Bl1 and BL2 respectively and emitters thereof are connected commonly to a transistor Tr9 which is operated in response to the foregoing bit line selection signal to the input terminal BS. When the transistor Tr9 is turned on, the transistors Tr7 and Tr8 supply voltage appearing across the bit lines BL1 and BL2 to a sense amplifier not illustrated as an output.

Next, a description will be given of the operation of the bipolar memory in the case of reading and writing cell information from and to the cell S11, together with reference to FIG. 2.

When reading cell information from the cell S11, a chip select signal SG1 having the level L is supplied to an input terminal CS indicating the selection of the chip. In response to the level L at the input terminal CS, a transistor Tr10 connected to the input terminal CS via a current switch circuit KS1 and an input transistor Tr9 produces an output having the level L, and the operation of the sense amplifier is enabled. At the same time, an address signal addressing the cell S11 is outputted from the address decoder 3 and the logic level of the word line WL1 is set to the level H. Further, a signal having the level H is supplied to the input terminal BS1 from the column decoder corresponding to the column C1, and thereby the cell S11 is specified in combination with the word line WL1.

In the case in which the logic level of the chip select signal SG1 is set to the level H, on the other hand, the transistor Tr10 connected to the sense amplifier not illustrated produces an output of the level H, and in response thereto, the output of the sense amplifier is shut off. In order to control the operation of the transistor Tr10 in response to the signal SG1 at the input terminal CS, an intermediate voltage between the level H and the level L is applied to an input terminal VBB1 constantly as a reference for discriminating the level of the signal SG1. The foregoing operation and construction are well known and thus, further description will be omitted.

Further, a write control signal SG2 is supplied to an input terminal WE with a level H, as shown in FIG. 2, indicating reading of information, in addition to and in synchronization with the chip select signal SG1 of the level L. In response thereto, a transistor 14 to which the signal SG1 is supplied after passing through a transistor Tr12 and a current switch K2 is controlled such that an emitter level thereof is set to a level H. To an input terminal VBB2, a voltage identical to the foregoing reference voltage to the input terminal VBB1 is applied as a reference for discriminating the level of the signal applied to the terminal WE.

When the emitter level of the transistor Tr14 is set to the level H in response to the write control signal SG2 having the level of L, transistors Tr15, Tr16 and Tr17 constituting a write amplifier part 4 are all turned on. In response thereto, transistors Tr18, Tr19, Tr20 and Tr21 are turned off irrespective of the input signal to a data input terminal DA of the write amplifier part 4. Further, in response to the turning off of the transistors Tr18, Tr19, Tr20 and Tr21, the emitter level of the transistors Tr22 and Tr23 are set at the level H. This in turn causes the turning on of transistors Tr24 and Tr25.

The transistor Tr24 has an emitter connected to the emitter of the transistor Tr3 used for selection of the bit line BL2, and the transistor Tr25 has an emitter which is connected to the emitter of the transistor Tr1 which is used for selection of the bit line BL1. It will be noted that the base voltage applied to the base of the transistors Tr24 and Tr25 is set higher than the corresponding base voltage of the transistors Tr1 and Tr2. Thus, when the transistors Tr24 and Tr25 are turned on, the transistors Tr1 and Tr3 are turned off. Further, a reference voltage having a level identical to that of the reference voltage supplied to the input terminals VBB1 and VBB2 is supplied to input terminals VBB3 and VBB4 continuously as a reference for discriminating the state of input data supplied to an input terminal DA. A description of this operation for discriminating the logic level of the input data to the terminal DA will be omitted as the construction thereof is well known and the operation thereof is not related to the subject matter of the present invention except that the input data is supplied to the transistors Tr18, Tr19, Tr20 and Tr20 and controls the state of the transistors Tr26 and Tr27 in addition to the write control signal at the input terminal WE.

In the state described heretofore, transistors Tr26 and Tr27 are further turned on in response to the turning on of the transistor Tr15, and these transistors Tr26 and Tr27 assume an unsaturated state because of provision of the resistors R1 and R2 and diodes D1 and D2. The transistors Tr26 and Tr27 have respective emitters which supply voltage from the respective emitters to the base of the transistor Tr5 connected to the bit line BL1 and to the base of the transistor Tr6 in response to the base voltage supplied thereto with a level variable between the level H and the level L. When the level of the write control signal SG2 is the level L, the emitter voltage at the transistors Tr26 and Tr27 has an identical level intermediate between the level H and the level L.

Thus, in the case where the cell S11 is selected and the cell information stored therein is to be read out, the transistors Tr2 and Tr4 are turned on in response to the signal of the level H to the input terminal BS while transistors Tr1 and Tr3 are turned off in response to the turning on of the transistors Tr24 and Tr25 which in turn is caused by the level H of the write control signal SG2 to the input terminal WE. When the transistor (not shown) in the cell S11 at the side of the bit line BL1 is in the turned-on state, a current IR flows from the word line WL1 through the cell S11, the bit line BL1 and the transistor Tr2. As a result, the logic level of the bit line BL1 changes to the level H. Further, the read current IR flows through the bit line BL2 and further through the transistor Tr4 from the transistor Tr6 which is turned on in response to the operation of the transistors Tr26 and Tr27 in the write amplifier 4 as already described, and thereby the logic level of the bit line BL2 is set to the level L. The voltage difference across the bit lines BL1 and BL2 is detected by the transistors Tr7 and Tr8 and supplied to the sense amplifier.

When writing cell information, the write control signal SG2 is set to the level L as shown in FIG. 2, and the voltage at a node A in the write amplifier 4 changes to the level L in response to the signal SG2 to the input terminal WE which now has the logic level L. In response thereto, one of the transistors Tr24 and Tr25 is turned on while the other is turned off, depending on whether the signal supplied to an input terminal DA has the logic level H or L.

Thus, when writing information to the cell S11 at the side of the bit line BL1, signals having the level H are supplied to the respective bases of the transistors Tr24 and Tr27, and signals having the level L are supplied to the respective bases of the transistors Tr25 and Tr26. In response thereto, the transistors Tr1, Tr2, Tr4 and Tr6 are turned on while the transistors Tr3 and Tr5 are turned off, and a write current IR+IW flows through the bit line BL1 from the word line WL1 and the cell S11 and a write current IR flows through the bit line BL2 from the transistor Tr6.

By constructing the memory as described above, a write current IR+IW which is substantially larger than the read current IR flows through the addressed cell S11 at the time of writing, and thereby it becomes possible to decrease the time needed to turn off the transistor at the side of the bit line BL2 and to turn on the transistor at the side of the bit line BL1.

In the bipolar random access memory, the writing speed is increased by increasing write current IR+IW. It should be noted, however, that such a bipolar random access memory has a construction wherein a large number of bit lines are connected to each of the word lines and thus a very large current flows through the word line when writing is carried out simultaneously in a number of bit lines. When such large current flows, an unacceptable voltage drop may occur in the address decoder 3 which eventually leads to a failure to provide a sufficient level of voltage for the logic level H or disconnection of the word line. Thus, there has been a limitation regarding the write current in the prior art bipolar random access memory, and associated therewith, a limitation regarding the writing speed in such a memory.

SUMMARY OF THE INVENTION

Accordingly, it is a general object of the present invention to provide a novel and useful bipolar random access memory wherein the aforementioned problems are eliminated.

Another and more specific object of the present invention is to provide a bipolar random access memory wherein the writing speed of cell informations is increased without increasing the load for writing, and, at the same time, without decreasing the reading speed.

Another object of the present invention is to provide a bipolar random access memory wherein reading and writing from and to a desired cell are carried out by selecting a word line and a pair of bit lines connected to the cell and causing to flow a predetermined read current and a predetermined write current, in which one of the bit lines connected to a bipolar transistor constituting a flip-flop circuit forming the cell and to be turned on in response to writing is caused to flow with a current increased relative to the predetermined read current used for reading, and in which the other of the bit lines connected to a bipolar transistor to be turned off in response to writing is caused to flow with a write current substantially decreased with respect to the predetermined read current used for reading. In a preferred embodiment, the write current to be supplied to the bipolar transistor to be turned on is decreased below the predetermined read current for a moment which may last a few seconds. According to the present invention, the writing speed of the memory is increased by increasing the ratio between the first write current supplied to one of the bipolar transistors to be turned on via one of the bit lines and the write current flowing through the other bit line connected to the other bipolar transistor to be turned off. Further by momentarily decreasing the write current to the bipolar transistor to be turned on before writing, the electric charges accumulated in the p-n junction of the transistor during the turned on state are effectively reduced and thus a further increase of the writing speed can be achieved.

Other objects and further features of the present invention will become apparent from the following detailed description when read in conjunction with the attached drawings.

DETAILED DESCRIPTION OF THE PREFERRED EMBODIMENTS

Next, the principle of the present invention will be described with reference to FIG. 3 which shows the general construction of the bipolar memory of the present invention.

Figure 3:
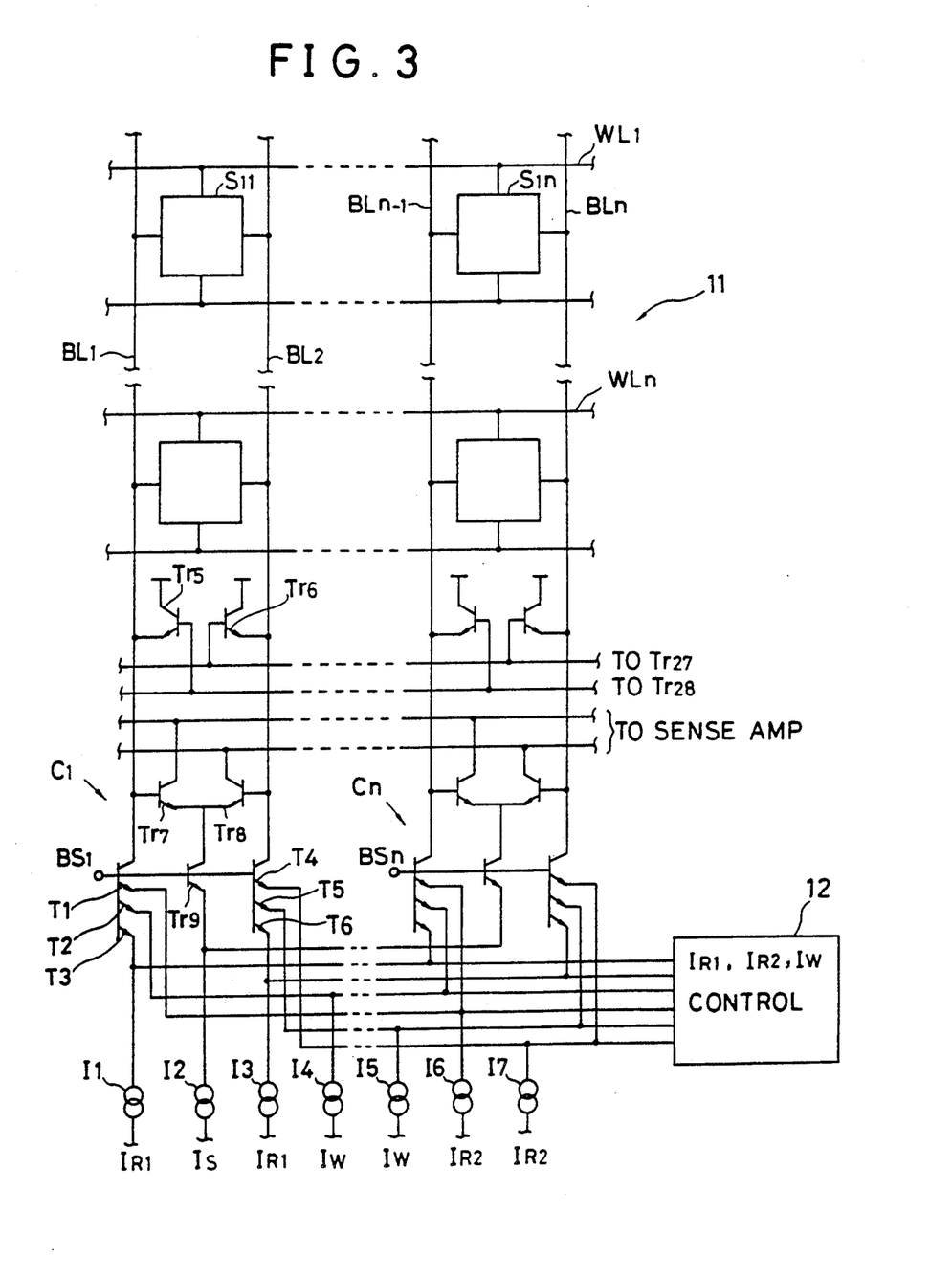
FIG. 3 is a block diagram showing the principle of the bipolar random access memory of the present invention.

Referring to FIG. 3, the bipolar memory comprises a memory cell array 11 similar to the cell region 1 and a control part 12 similar to the control part 2 of FIG. 1. In the memory cell array 11, the parts and elements constructed identically to the corresponding parts and elements in the preceding FIG. 1 are given identical reference numerals and thus a description thereof will be omitted.

In the memory cell array 11 of FIG. 3, transistors T1, T2 and T3 are used in place of the transistors Tr1 and Tr2 of FIG. 1 and these transistors T1–T3 have the bases and collectors which are shared in common. Further, transistors T4, T5 and T6 are used in place of the transistors Tr3 and Tr4 and also have bases and collectors which are shared commonly.

A current source Ib is connected to the emitter of the transistor T1 to cause a first constant current IR2 to flow. Similarly, a current source I4 is connected to the emitter of the transistor T2 to cause a second constant current IW to flow. Further, a current source I1 is connected to the emitter of the transistor T3 to cause a third constant current IR1 to flow.

A current source I7 is connected to the emitter of the transistor T4 to cause a current identical to the first constant current IR2 to flow, a current source I5 is connected to the emitter of the transistor T5 to cause a current identical to the second constant current IW to flow, and a current source I3 is connected to the emitter of the transistor T6 to cause a current identical to the third constant current IR1 to flow.

Figure 4:
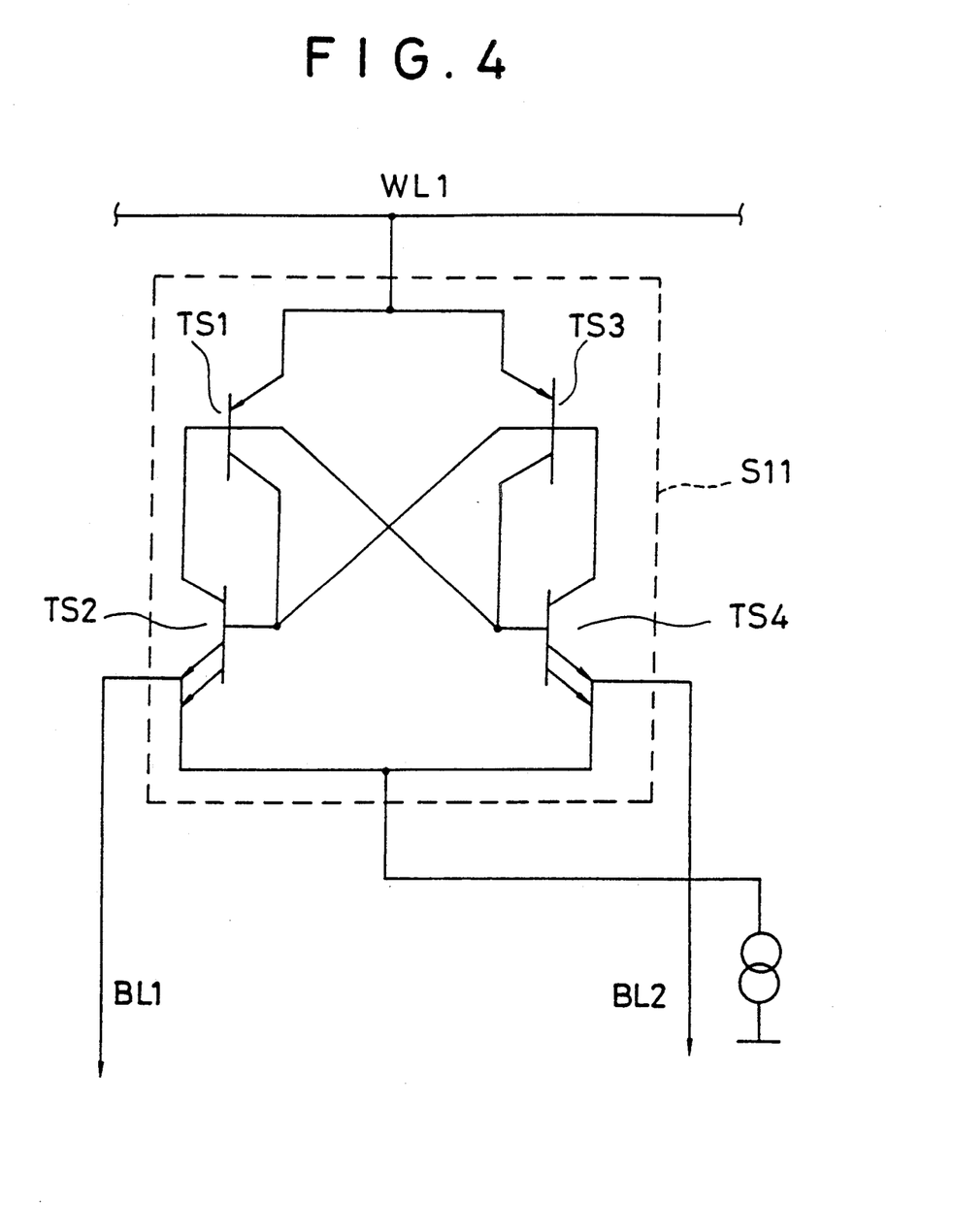
FIG. 4 is a circuit diagram showing a flip-flop circuit used in the memory cell in the bipolar random access memory of FIG. 3.

FIG. 4 shows the construction of the memory cell S11. The construction of other memory cells are identical and therefore a description of these other cells will be omitted.

Referring to FIG. 4, the memory cell S11 includes bipolar transistors TS1 and TS2 connected to the word line WL1 and bipolar transistors TS2 and TS4 connected to the bit lines BL1 and BL2. Further, the transistors TS1–TS4 are connected such that there is formed a flip-flop circuit by the transistor TS2 and TS4. In the description hereinafter, it will be assumed that the transistor TS2 is turned on and the transistor TS4 is turned off in the initial state. Thus, when the cell information is updated, the transistor TS2 is turned off and the transistor TS4 is turned on, as will be described.

When reading the cell information, the chip select signal SG1 is supplied to the input terminal CS, with the level L indicating the selection of this chip, and the write control signal SG2 is supplied to the input terminal WE, with the level H indicating reading from the memory. Further, a bit line selection signal is supplied to the input terminal BS1. See FIG. 5, region I. In response thereto, a current having a total magnitude of IR1+IR2 flows from the word line WL1 through the bit line BL1 on the one hand to the current source I1 via the transistor T3 and on the other hand to the current source I6 via the transistor T1 under control of the control part 12 to be described later. Further, the same total current of IR1+IR2 flows from the transistor Tr6 through the bit line BL2 on the one hand to the current source I3 via the transistor T6 and on the other hand to the current source I7 via the transistor T4 also under control of the controller 12. The transistors Tr7 and Tr8 detect the voltage across the bit lines BL1 and BL2 and supply the detected voltage to the sense amplifier not shown in the drawing. When the transistor TS4 is turned on and the transistor TS2 is turned off, on the other hand, a total current of IR1+IR2 flows from the word line WL1 through the bit line BL2 via the transistor TS4 and this current is passed on the one hand to the current source I3 via the transistor T6 and on the other hand to the current source I7 via the transistor T4. See FIG. 5, region I.

When writing an information to the memory cell S11 by turning the transistor TS4 on and turning the transistor TS2 off, the level of the write control signal SG2 is changed to the level L, and a voltage higher than the base voltage to the transistor TS2 is supplied to the base of the transistor Tr5 from the transistor Tr26 shown in FIG. 1. Further, a voltage lower than the base voltage to the transistor TS4 is supplied to the base of the transistor Tr6 from the transistor Tr27 in FIG. 1. In response thereto, the current flowing through the bit line BL1 is decreased and the current flowing through the bit line BL2 is increased as is well known. Thereby, a current IR1+IW is caused to flow through the transistor TS4, passing through the bit line BL2 and further through the transistors T5 and T6 to the current source I3 and the current source I5. Further a current IR1 is flowed through the transistor Tr5 passing through the bit line BL1 and further through the transistor T3 to the current source I1. See FIG. 5, region I1. In response to the increase of the current in the bit line BL2 and the decrease of the current in the bit line BL1, an increase of the writing speed is achieved without increasing the total current flowing through the word line WL1. Note that the total current flowing through the word line WL1 is IR1+IR2 at the time of reading while the total current flowing through the word line WL1 is IR1+IW.

In order to control the current flowing through the transistors T1–T6, the bipolar random access memory of the present invention uses a controller 12 which supplies a current equal to the current IR2 to the current sources I6 and I7 at the time of writing. Further, the controller 12 supplies a current equal to the current IW to the current sources I4 and I6 at the time of reading.

Figure 6:
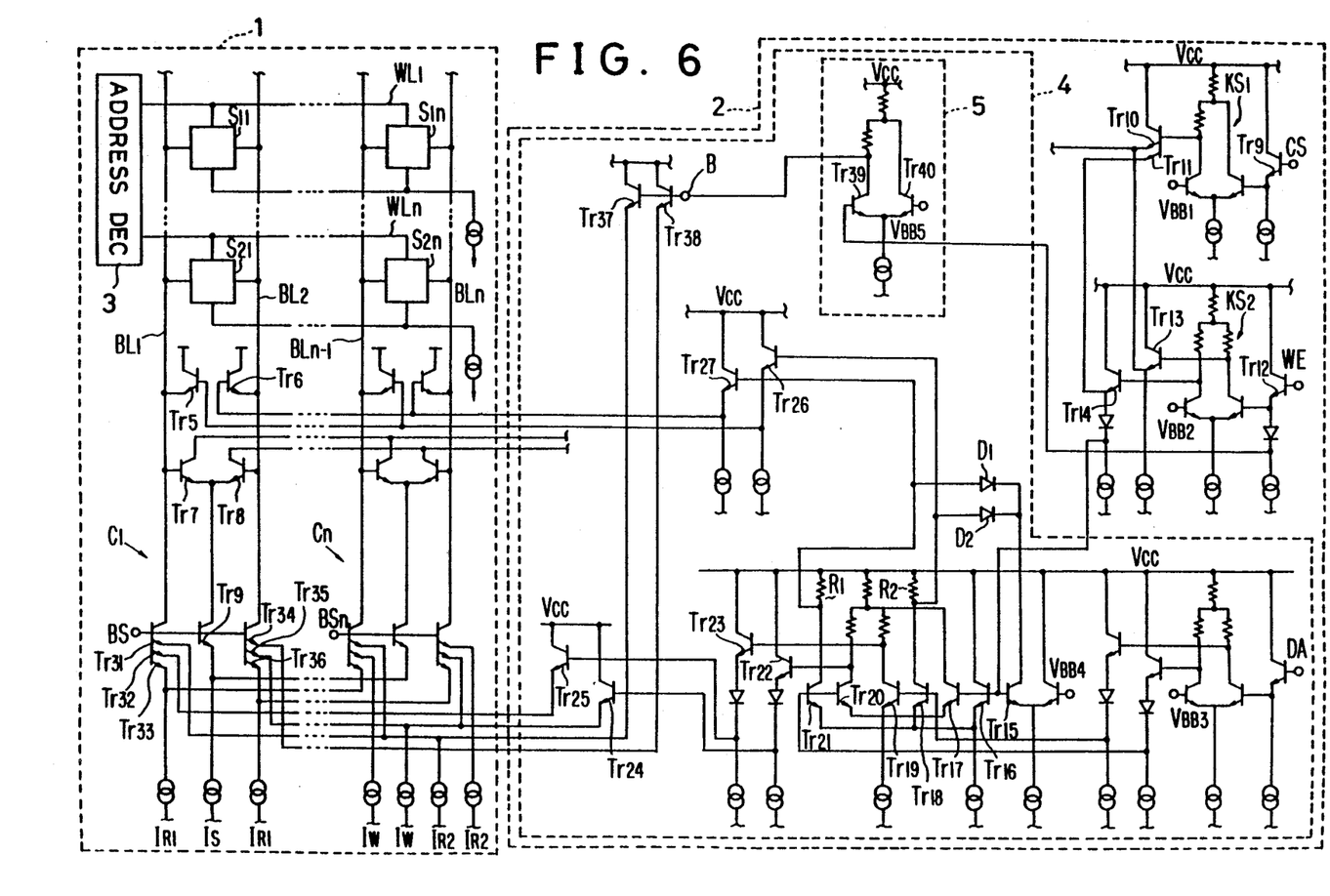
FIG. 6 is a detailed circuit diagram showing the construction of the bipolar random access memory in accordance to an embodiment of the present invention.

Next, an embodiment of the present invention will be described with reference to FIG. 6. In the drawing, the parts and elements corresponding to those already described are given identical reference numerals and the description thereof will be omitted.

Referring to FIG. 2, transistors Tr31, Tr32 and Tr 33 respectively corresponding to the transistors T1, T2 and T3 of FIG. 3 are provided in such a manner as to share the base and collector in common, and transistors Tr34, Tr35 and Tr36 respectively corresponding to the transistors T4, T5 and T6 of FIG. 3 are provided in such a manner as to share the base and collector in common. When each of these transistors is turned on, a current having the magnitude IW flows through the transistors Tr32 and Tr35, and a current having the magnitude IR2 flows through the transistors Tr31 and Tr34. It will be noted that the magnitude IW is equal to the magnitude of the write current IW explained with reference to FIGS. 1 and 2. Further, the magnitude of currents IR1 and IR2 are set such that the total current IR1+IR2 equals the read current IR explained with reference to FIGS. 1 and 2.

The emitter of the transistor 25 is connected to the emitter of the transistor Tr32 and the emitter of the transistor Tr24 is connected to the emitter of the transistor Tr35. Thus, when the transistors Tr24 and Tr25 are tuned on, the transistors Tr32 and Tr35 are turned off.

Further transistors Tr37 and Tr38 are provided such that the emitters of the transistors Tr37 and Tr38 are connected to the respective emitters of the transistors Tr31 and Tr34, and the transistors Tr31 and Tr34 are turned off in response to the turning on of the transistors Tr37 and Tr38. The bases of the transistors Tr37 and Tr38 are connected to the collector of a transistor Tr39 which forms an inversion circuit 5 together with another transistor Tr40 and resistors R3 and R4.

In the inversion circuit 5, the base of the transistor Tr39 is connected to the emitter of the transistor Tr12 to which the input terminal WE is provided and a reference voltage having a level intermediate to the level H and the level L is supplied to an input terminal VBB5 connected to the base of the transistor Tr40.

Figure 5:
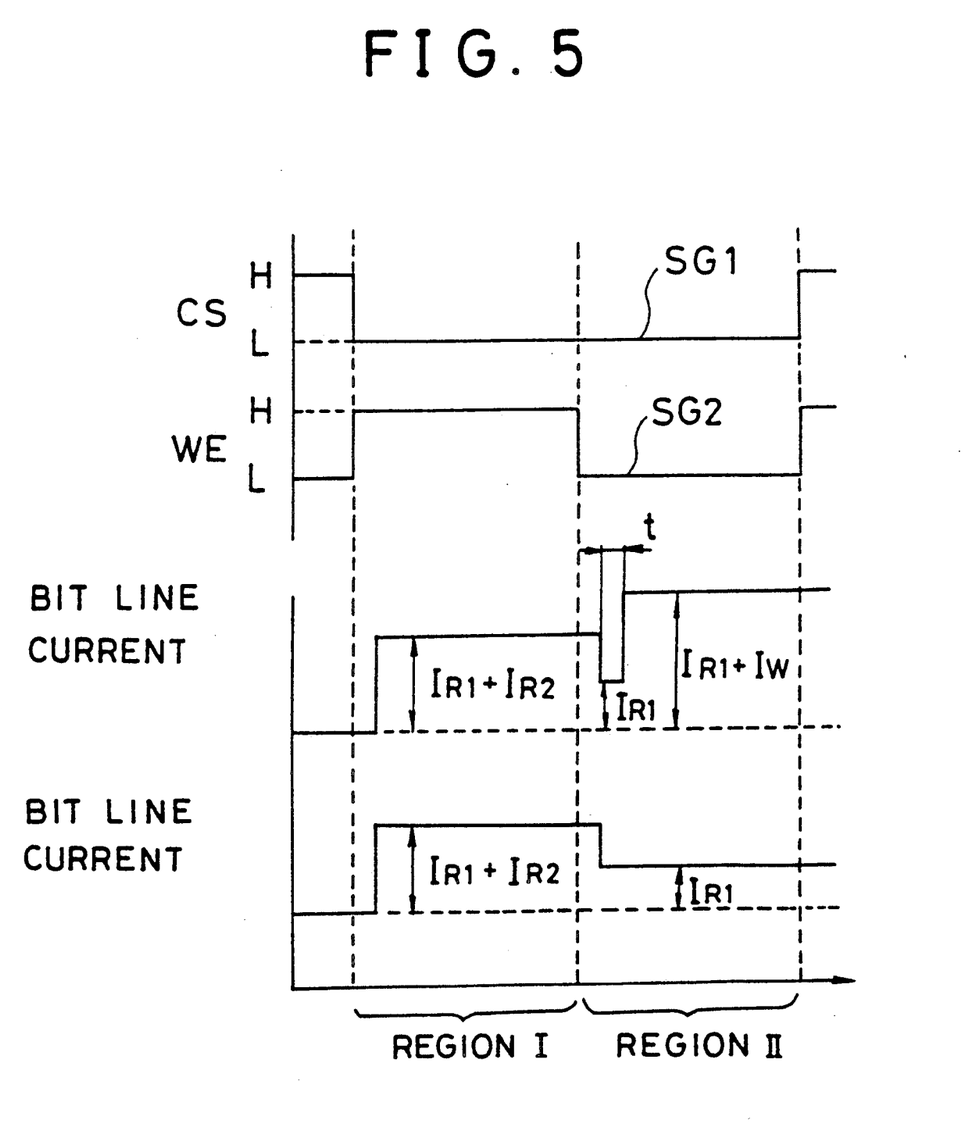
FIG. 5 is a diagram for explaining the reading and writing operation of the bipolar random access memory of FIG. 3.

Next, the operation of the random access memory of FIG. 6 will be described. In the case where the cell S11 is selected and the cell information in the cell S11 is read out, the voltage level of the word line WL1 is changed to the level H by the address decoder 3 and at the same time a bit select signal having the level H is supplied to the input terminal BS from the column decoder not illustrated. Further, the chip select signal SG1 having the level L is supplied to the input terminal CS and the write control signal SG2 having the level H is supplied to the input terminal WE as shown in FIG. 5. In response thereto, the transistors Tr24 and Tr25 are both turned on. Further, the transistor Tr39 is turned on and the level at a node B shown in FIG. 6 is changed to the level L, which is lower than the level of the input terminal BS. As a result, the transistors Tr37 and Tr38 are turned off and a base voltage having a level intermediate between the level H and the level L is supplied to the bases of the transistors Tr5 and Tr6 as a read mode level.

Thus, the transistors Tr31, Tr33, Tr34, and Tr36 in the column C1 are turned on in this state. When the transistor TS4 is turned on, for example, in response to the storage of the cell information, a read current IR1+IR2 flows through the bit line BL1 from the transistor Tr5 while a read current IR1+IR2 flows through the bit line BL2 from the word line WL1, passing through the cell S11 and the transistors Tr34 and Tr36. As a result, the voltage level of the bit line BL1 changes to the low level L while the voltage level of the bit line BL2 changes to the level H. This voltage difference is detected by the transistors Tr7 and Tr8 and supplied to the sense amplifier, not shown, as already described.

Next, a description will be made with regard to a case wherein the information stored in the cell S11 is updated by writing. In the write mode, the level of the write control signal SG2 to the input terminal WE is changed to the level L and in response thereto, the transistor Tr39 is turned off. As a result, the voltage level at the node B changes to the level H and the transistors Tr37 and Tr38 are turned on. In response to the turning on of the transistors Tr37 and Tr38, the transistors 31 and Tr34 are turned off and the currents flowing through the bit line BL1 and the bit line BL2 are both reduced from IR1+IR2 to IR1.

With a slight time-lag t in the order of a few seconds from this state, the transistor Tr25 which has been turned on previously is turned off while the transistor Tr24 maintains the turn-on state. Then, the current flowing through the bit line BL1 from the word line WL1 passing through the cell S11 and the transistors Tr32 and Tr33 increases from IR1 to IR1+IW after the foregoing time-lag t measured from the instant at which the current has decreased from the level IR1+IR2. On the other hand, the current IR1 continues flowing through the bit line BL2 from the transistor Tr6.

Next, the reason why the foregoing time-lag appears will be explained. As will be understood, the inversion of the state of the transistors Tr37 and Tr38 is achieved in response to the inversion of the state of the write control signal SG1 which is supplied via the transistors Tr12 and Tr39. On the other hand, the inversion of the state of the transistors Tr24 and Tr25 is made in response to the same write control signal SG1 which is supplied via the transistor Tr12, current switch KS2, and transistors Tr14, Tr17, Tr19, Tr20, Tr22 and Tr23. Thus, there is a difference in the number of stages included in the signal path extending from the input terminal WE to the transistors Tr37 and 38 and the signal path extending from the same input terminal WE to the transistors Tr24 and Tr25. As already noted, this time lag t amount to about a few nanoseconds.

By decreasing the write current flowing through the bit lines BL1 and BL2, the electric charges accumulated in the transistor which is in the turn-on state in the cell S11 are reduced and the turning off of this transistor is achieved quickly. The writing speed of the cell is further increased by the increasing of the write current IR1+IW which is larger than the read current IR1+IR2.

According to the present invention, the current flowing through the word line is held to the level IR1+IW and thus, the increasing of the load to the word line is prevented while increasing the read current.

Further, the present invention is not limited to the embodiments described heretofore, as various variations and modifications may be made without departing from the scope of the invention.

What is claimed is:

1. A bipolar random access memory comprising:

a plurality of memory cells arranged in a row and column formation, wherein said memory cells are arranged into a plurality of rows and a plurality of columns, each of said memory cells being capable of storing cell information selected from first cell information and second cell information and having a first side and a second side, opposite from the first side, wherein the first side assumes a first state and the second side assumes a second state, opposite from the first state, when the first cell information is stored in one of said memory cells, and wherein the first side assumes the second state and the second side assumes the first state when the second cell information is stored in one of said memory cells;

a plurality of word lines corresponding to respective rows of said memory cells such that, in each row of said memory cells, a word line is connected commonly to each of said memory cells in each row;

a plurality of bit lines corresponding to respective columns of said memory cells such that, in each column of said memory cells, a pair of adjacent bit lines are connected commonly to each of said memory cells in each column, one at the first side and another at the second side;

row addressing means connected to each of said plurality of word lines for selecting one of the word lines connected to one of the plurality of rows of said memory cells;

column addressing means connected to each pair of adjacent bit lines for selecting one of the pairs of adjacent bit lines;

each of said memory cells causing a current to flow from the word line connected thereto to one of the bit lines connected to one of the first and second side thereof which assumes the first state while not causing a current to flow from the word line connected thereto to another of the bit lines connected to the other side thereof which assumes the second state;

read/write control means for receiving and writing cell information into an addressed memory cell, which is a memory cell in a row selected by the row addressing means and in a column selected by the column addressing means, for outputting a read/write control signal to indicate whether the memory cells are to be operated in one of a reading mode and a writing mode, for supplying, when in the reading mode, a read current to the bit line connected to one of the first and second sides of the addressed memory cell which assumes the second state, and for supplying, when in the writing mode, a write current to the bit line connected to one of the first and second side of the addressed memory cell which has a state to be changed from the first state to the second state;

first current control means, connected to a first selected bit line connected commonly to an addressed memory cell in a column selected by the column addressing means at the first side of the memory cells, for decreasing the write current flowing through the first selected bit line when in the writing mode and when the state of the first side of the addressed memory cell is to be changed from the first state to the second state in response to writing of the cell information, and for increasing the write current flowing through the first selected bit line when in the writing mode and when the state of the first side of the addressed memory cell is to be changed from the second state to the first state;

second current control means, connected to a second selected bit line connected commonly to an addressed memory cell in a column selected by the column addressing means at the second side of the memory cells, for decreasing the write current flowing through the second selected bit line when in the writing mode and when the state of the second side of the addressed memory cell is to be changed from the first state to the second state in response to writing of the cell information, and for increasing the write current flowing through the second selected bit line when in the writing mode and when the state of the second side of the addressed memory cell is to be changed from the second state to the first state; and third current control means, connected to the first and second current control means, for receiving the cell information to be written and the write control signal and for selectively controlling the first and second current control means in response to the write control signal and the cell information.

2. A bipolar random access memory as claimed in claim 1, wherein said third current control means comprises means for controlling the first and second current control means to operate in the writing mode such that the write current flowing through the first selected bit line is decreased and the write current flowing through the second selected bit line is increased when the state of the first side of the addressed memory cell is to be changed from the first state to the second state and when the state of the second side of the addressed memory cell is to be changed from the second state to the first sate, and means for controlling the first and second current control means to operate in the writing mode such that the write current flowing through the first selected bit line is increased and the write current flowing through the second selected bit line is decreased when the state of the first side of the addressed memory cell is to be changed from the second state to the first state and when the state of the second side of the addressed memory cell is to be changed from the first sate to the second state.

3. A bipolar random access memory as claimed in claim 1, wherein said first current control means comprises a first bipolar transistor, a second bipolar transistor and a third bipolar transistor in each of the column such that the first, second and third bipolar transistors respectively have collectors connected commonly to one of the bit lines which are connected commonly to the first side of each of the memory cells in the column and respectively having bases connected commonly to the column addressing means, said first bipolar transistor having an emitter connected to a first constant current source to cause a first predetermined current to flow, said second bipolar transistor having an emitter connected to a second constant current source to cause a second predetermined current to flow, and said third bipolar transistor having an emitter connected to a third constant current source to cause a third constant current to flow, wherein said second current control means comprises a fourth bipolar transistor, a fifth bipolar transistor and a sixth bipolar transistor in each of the columns of the memory cells such that the fourth, fifth and sixth bipolar transistors respectively have collectors connected commonly to one of the bit lines which are connected commonly to the second side of each of the memory cells in the column and respectively having bases connected commonly to the column addressing means, said fourth transistor having an emitter connected to a fourth constant current source to cause the first predetermined current to flow, said fifth transistor having an emitter connected to a fifth constant current source to cause the second predetermined current to flow, and said sixth transistor having an emitter connected to a sixth constant current source to cause the third constant current to flow, wherein said third control means comprises means for controlling levels of the emitters of the first, second, third, fourth, fifth and sixth transistors such that the write current flowing through the first selected bit line, when the first current control means is selectively controlled to increase the write current, becomes a sum of the second and third predetermined currents such that the write current flowing through the second selected bit line, when said second control means is selectively controlled to decrease the write current, becomes identical to the third predetermined current, such that the write current flowing through the first selected bit line, when said first current control means is selectively controlled to decrease the write current, becomes identical to the third predetermined current, and such that the write current flowing through the second selected bit line, when the second control means is selectively controlled to increase the write current, becomes identical to the sum of the second and third predetermined currents.

4. A random access memory as claimed in claim 3, wherein said third current control means comprises means for supplying the first predetermined current to the first constant current source and for supplying the first predetermined current to the fourth constant current source when in the writing mode.

5. A random access memory as claimed in claim 3, wherein said third current control means comprises means for supplying a first read current, having a magnitude equal to a sum of the first and second predetermined currents, to the bit line connected to the first side of the addressed memory cell and for supplying a second read current, having a magnitude similar to the first read current, to the bit line connected to the second side of the addressed memory cell when in the reading mode.

6. A bipolar random access memory as claimed in claim 3, wherein said third current control means comprises means for decreasing the write current in the bit line connected to the side of each of the memory cells of which the state is to be changed from the second state to the first state, prior to an increase to a level of the sum of the second and third predetermined currents.

7. A bipolar random access memory as claimed in claim 6, wherein each of said first and second current control means comprise means for decreasing the write current for about a few nanoseconds.

8. A bipolar random access memory, comprising:
a plurality of memory cells arranged in rows and columns, each of said memory cells having a first side and a second side, wherein when the first side assumes a first state, the second side assumes a second state opposite from the first state, and wherein when the first side assumes the second state, the second side assumes the first state;
a plurality of word lines connected to respective rows of said memory cells;
a plurality of pairs of first and second bit lines, each said pair of first and second bit lines connected to respective columns of said memory cells;
read/write control means for selecting a selected memory cell common to a selected row and a selected column, wherein the selected memory cell has a first selected bit line and a second selected bit line;
constant current means for providing first through sixth predetermined constant currents; and
current control means for increasing the first write current flowing through the first selected bit line to a sum of the second predetermined current and the third predetermined current when the first side of the selected memory cell changes from the second state to the first state when writing, for decreasing the second write current flowing through the second selected bit line to the sixth predetermined current when the second side of the selected memory cell changes from the first state to the second state when writing, for decreasing the first write current flowing through the first selected bit line to the third predetermined current when the first side of the selected memory cell changes from the first state to the second state when writing, and for decreasing the second write current flowing through the second selected bit line to a second sum of the fifth predetermined current and the sixth predetermined current when the second side of the selected memory cell changes from the second state to the first state when writing.

9. A random access memory as claimed in claim 8, wherein said current control means comprises:
first read current means for supplying a first read current to the first selected bit line, the first read current having a magnitude equal to a sum of the first predetermined current and the second predetermined current when in the reading mode; and
second read current means for supplying a second read current to the second selected bit line, the second read current having a magnitude equal to a sum of the fourth predetermined current and the fifth predetermined current when in the reading mode.

10. A bipolar random access memory as claimed in claim 8, wherein said current control means comprises:
momentary means for momentarily decreasing the one of the first and second write currents prior to the increase to the level having a value equal to the sum of the second and third predetermined currents in one of the selected first and second bit lines associated with a side of the memory cell to be changed from the second state to the first state.

* * * * *

UNITED STATES PATENT AND TRADEMARK OFFICE
CERTIFICATE OF CORRECTION

PATENT NO. : 5,083,292
DATED : January 21, 1992
INVENTOR(S) : YAMADA, et al.

It is certified that error appears in the above-indentified patent and that said Letters Patent is hereby corrected as shown below:

On the title page, [73] after "Fujitsu Limited, Kawasaki, Japan" insert --and Fujitsu VLSI Limited, Aichi, Japan--.

Signed and Sealed this

Twenty-ninth Day of March, 1994

Attest:

BRUCE LEHMAN

*Attesting Officer*       *Commissioner of Patents and Trademarks*